(12) United States Patent
Chen et al.

(10) Patent No.: US 7,960,731 B2
(45) Date of Patent: Jun. 14, 2011

(54) MULTI-LAYERED COMPLEMENTARY CONDUCTIVE LINE STRUCTURE

(75) Inventors: Yu-Cheng Chen, Hsinchu (TW);
Chi-Lin Chen, Hsinchu (TW);
Chi-Ming Chang, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 532 days.

(21) Appl. No.: 11/870,426

(22) Filed: Oct. 11, 2007

(65) Prior Publication Data

US 2008/0029902 A1 Feb. 7, 2008

Related U.S. Application Data

(62) Division of application No. 11/164,022, filed on Nov. 8, 2005, now Pat. No. 7,300,811.

(30) Foreign Application Priority Data

Jul. 21, 2005 (TW) ................................. 94124655 A (51) Int. Cl.
*H01L 21/84* (2006.01)
(52) U.S. Cl. ...................................... 257/59; 257/E27.1
(58) Field of Classification Search .............. 257/59–65, 257/347–354, E27.1
See application file for complete search history.

(56) References Cited

U.S. PATENT DOCUMENTS

| 4,938,567 A * | 7/1990 | Chartier ........................ 359/245 |
| 2003/0073267 A1 | 4/2003 | Baek et al. |
| 2005/0073619 A1 * | 4/2005 | Chen et al. ..................... 349/43 |

\* cited by examiner

*Primary Examiner* — Richard A. Booth
(74) *Attorney, Agent, or Firm* — Jianq Chyun IP Office (57) ABSTRACT

A multi-layered complementary conductive line structure, a manufacturing method thereof and a manufacturing method of a TFT (thin film transistor) display array are provided. The process of TFT having multi-layered complementary conductive line structures does not need to increase the mask number in comparison with the currently process and is able to solve the resistance problem of the lines inside a display.

10 Claims, 13 Drawing Sheets

Forming M1    MASK-1

MULTI-LAYERED COMPLEMENTARY CONDUCTIVE LINE STRUCTURE

CROSS-REFERENCE TO RELATED APPLICATION

This application is a divisional of an application Ser. No. 11/164,022, filed on Nov. 8, 2005, now allowed, which claims the priority benefit of Taiwan application Ser. No. 94124655, filed on Jul. 21, 2005. The entirety of each of the above-mentioned patent applications is incorporated herein by reference and made a part of this specification.

BACKGROUND OF THE INVENTION

1. Field of Invention

The present invention relates to a conductive line structure, a manufacturing method thereof and a manufacturing method of a thin film transistor (TFT) display array, and particularly to a multi-layered complementary conductive line structure capable of solving the line resistance problem, a manufacturing method thereof and a manufacturing method of a TFT display array having the conductive line structure.

2. Description of the Related Art

Along with an increasing display panel size, the total length of the metal conductive lines in a TFT display is accordingly increased, which makes the time delay phenomenon a remarkable problem for a good display quality. Since a LCD TV panel over 37 inch size today generally has a 16:9 panel aspect ratio of width over height, the RC (resistance-capacitance) delay time problem caused by scan lines are more significant than data lines. To solve the RC delay problem for a better display quality, most manufacturers take a bilateral driving mode. The scheme in bilateral driving mode needs more IC drivers, not to mention a higher packaging cost is necessary.

Figure 1:
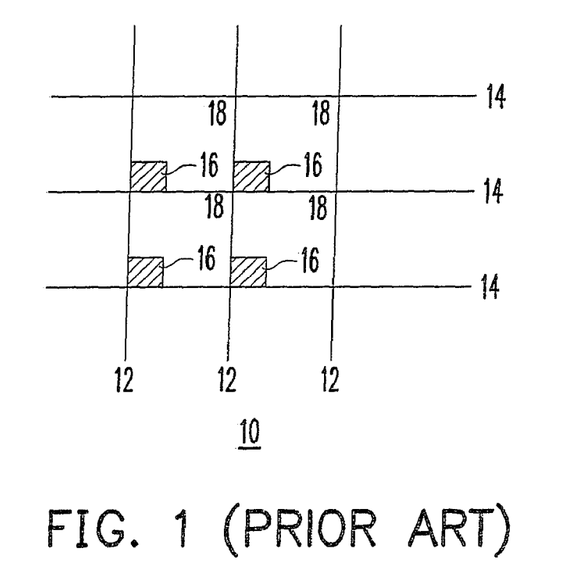
FIG. 1 is a diagram of a conventional TFT display array structure.

FIG. 1 is a diagram of a conventional TFT display array structure. Referring to FIG. 1, a TFT array 10 comprises a plurality of pixels 18 arranged in an array. Each pixel 18 includes a TFT 16, and a plurality of gate scan lines 14 in horizontal parallel arrangement and a plurality of data lines 12 in vertical parallel arrangement together partition every pixel. Each TFT 16 is connected to and driven by a pair of the gate scan line 14 and a data line 12.

Figure 2:
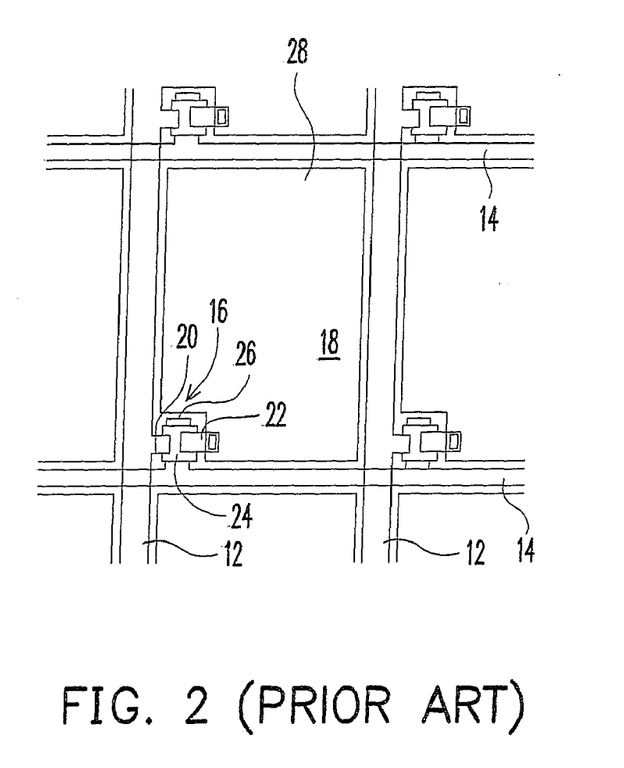
FIG. 2 is a pixel structure diagram of a conventional TFT display.

FIG. 2 is a pixel structure diagram of a conventional TFT display. Referring to FIG. 2, each pixel 18 has a TFT 16, the gate scan line 14 connects the gate terminal 26 of the TFT 16 and the data line 12 connects the source terminal 20 of the TFT 16. The drain terminal 22 of the TFT 16 is connected to a pixel electrode 28 of the pixel 18. TFT 16 serves as a switch component for controlling switches through the gate scan line 14 and connecting the data line 12 to the pixel electrode 28 of the pixel 18.

Figure 3:
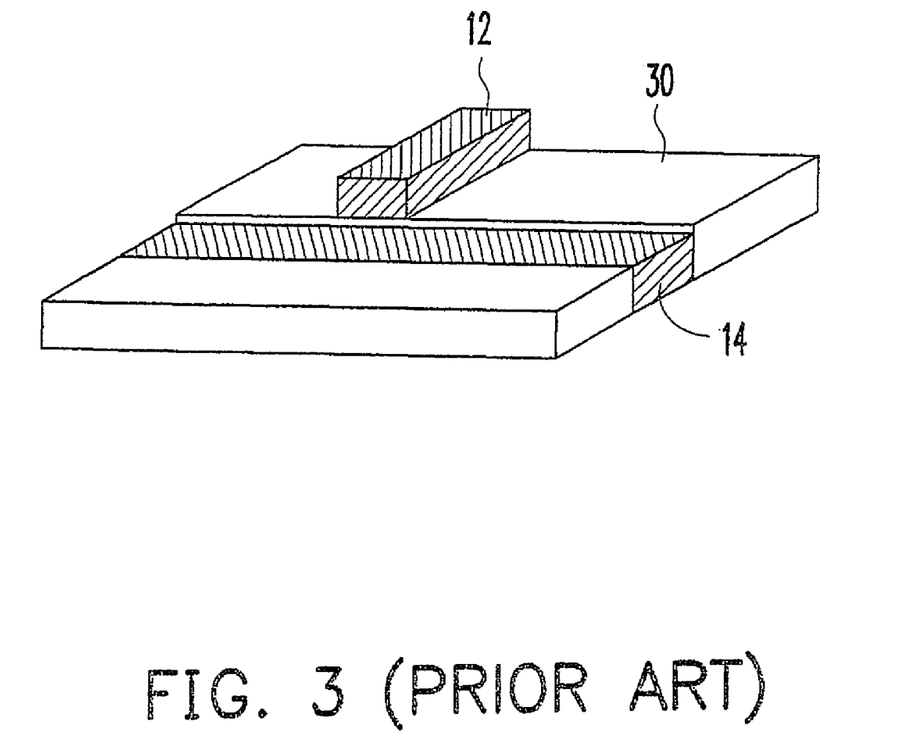
FIG. 3 is a schematic 3-dimensional drawing showing a data line and a gate scan line.

FIG. 3 is a schematic 3-dimensional drawing showing a cross portion of a data line and a gate scan line. Referring to FIG. 3, a data line 12 and a gate scan line 14 belong to different metal layers, respectively and are isolated from each other by an isolating layer 30, and the two lines are not connected to each other. As described above, along with an increasing display panel size, the total length of the metal connection lines in a TFT display and the corresponded resistance of the data lines and the gate scan lines are noticeably increased, which makes the time delay phenomenon a remarkable problem for a good display quality.

SUMMARY OF THE INVENTION

The present invention provides a multi-layered complementary conductive line structure, a manufacturing method thereof and a manufacturing method of a TFT display array having the multi-layered complementary conductive line structure. By means of manufacturing the TFT display array having the multi-layered complementary conductive line structure without increasing masks in the process, the conductive line resistance problem of a display is expected to be solved.

In an embodiment, a manufacturing method of a multi-layered complementary conductive line structure is provided, the method at least includes forming a first conductive material layer on a substrate. By patterning the first conductive material layer, gate scan lines on the first layer and discontinuous data lines on the first layer are defined. In succession, a gate insulating layer, an active layer and a doping layer are deposed on the above-mentioned first conductive material layer and the substrate. By patterning the above-mentioned gate insulating layer, active layer and doping layer, a region of cross-interconnection is defined. A second conductive material layer on the substrate is formed hereafter. By patterning the second conductive material layer, data lines on the second layer and discontinuous gate scan lines on the second layer are defined, wherein the above-mentioned discontinuous gate scan lines on the second layer and the gate scan lines on the first layer are fitting-contacted to each other and form a scan line structure. While the discontinuous data lines on the first layer and the data lines on the second layer are fitting-contacted to each other and form a data line structure.

In an embodiment, a manufacturing method of a multi-layered complementary conductive line structure is provided, the method at least includes forming a first conductive material layer on a substrate. By patterning the above-mentioned first conductive material layer, a gate scan line on the first layer is defined. In succession, a gate insulating layer, an active layer and a doping layer are deposed on the above-mentioned first conductive material layer and the substrate. By patterning the above-mentioned gate insulating layer, active layer and doping layer, a region of cross-interconnection is defined. A second conductive material layer on the substrate is formed hereafter. By patterning the second conductive material layer, a data line on the second layer and a discontinuous gate scan line on the second layer are defined, wherein the above-mentioned discontinuous gate scan line on the second layer and the gate scan line on the first layer are fitting-contacted and form a scan line structure.

In an embodiment, a manufacturing method of a multi-layered complementary conductive line structure is provided, the method at least includes forming a first conductive material layer on a substrate. By patterning the above-mentioned first conductive material layer, a gate scan line and a discontinuous data line on the first layer are defined. In succession, a gate insulating layer, an active layer and a doping layer are deposed on the above-mentioned first conductive material layer and the substrate. By patterning the above-mentioned gate insulating layer, active layer and doping layer, a region of cross-interconnection is defined. A second conductive material layer on the substrate is formed hereafter. By patterning the second conductive material layer, a data line on the second layer is defined, wherein the above-mentioned discontinuous data line on the first layer and the data line on the second layer are fitting-contacted and form a data line structure.

In another embodiment, the present invention provides a manufacturing method of a TFT display array. The method at least includes forming a first conductive material layer on a substrate. By patterning the first conductive material layer, a scan line on the first layer and a discontinuous data line on the first layer are defined. In succession, a gate insulating layer, an active layer and a doping layer are deposed on the above-mentioned first conductive material layer and the substrate. By patterning the above-mentioned gate insulating layer, active layer and doping layer, an active region and a region of cross-interconnection are defined. A second conductive material layer on the substrate is formed hereafter. By patterning the second conductive material layer, a data line on the second layer and a discontinuous scan line on the second layer are defined. In addition, the patterned doping layer is divided into a first doping region and a second doping region. Wherein the above-mentioned discontinuous scan line on the second layer and the scan line on the first layer form together a scan line structure, the above-mentioned discontinuous data line on the first layer and the data line on the second layer are fitting-contacted to each other to form a data line structure, and the above-mentioned gate insulating layer, active layer, first doping region and second doping region form a TFT structure. Further, a planarized layer is formed on the substrate, and by patterning the planarized layer, a contact hole is formed; a transparent electrode layer is formed on the substrate, and the transparent electrode layer connects the patterned second conductive material layer via the contact hole.

In another embodiment, a manufacturing method of a multi-layered complementary conductive line structure is provided, the method at least includes forming a first line and/or a second wire. The first line at least includes a first main-line and a plurality of first branch-lines. Wherein, a surface of each first branch-line and a surface of the first main-line are fitting-contacted to each other to form a first line structure. The second line at least includes a second main-line and a plurality of second branch-lines. Wherein, a surface of each second branch-line and a surface of the second main-line are fitting-contacted to each other to form a second line structure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

FIGS. 4A-4G are section drawings for showing a process flowchart of a typical TFT. Firstly, referring to FIG. 4A, according to the TFT process, a metal layer M1 is formed on a substrate 410. The substrate 410 can be a silicon substrate, a glass substrate or a plastic substrate, etc. The metal layer M1 can be a conductive material made of aluminum metal or copper metal. Next, a photolithography and an etching are employed in the TFT process, and the metal layer M1 is patterned by a first mask Mask-1 into a gate 420 on the substrate 410. Further, referring to FIG. 4B, a gate insulating layer, an active layer and a doping layer are globally formed by means of, for example, deposition in sequence on the substrate 410. In more detail, the forming process can be, for example, conducting depositions of an insulating layer 430, an amorphous silicon (a-Si) layer 440 and an Ohmic contact layer 450 to cover the gate 420, and the Ohmic contact layer is made of n+a-Si material. Then, referring to FIG. 4C, a photoresist layer is formed on the Ohmic contact layer 450 and the photoresist layer is patterned by a second mask Mask-2. The patterned photoresist layer serves as a new mask for etching the Ohmic contact layer 450 and the a-Si layer 440. The etching can be, for example, a dry etching for removing the Ohmic contact layer 450 and the a-Si layer 440 uncovered by the patterned photoresist layer, so that the patterned Ohmic contact layer 450a and the a-Si layer 440a are formed, by which a channel region is defined.

Figure 4A:
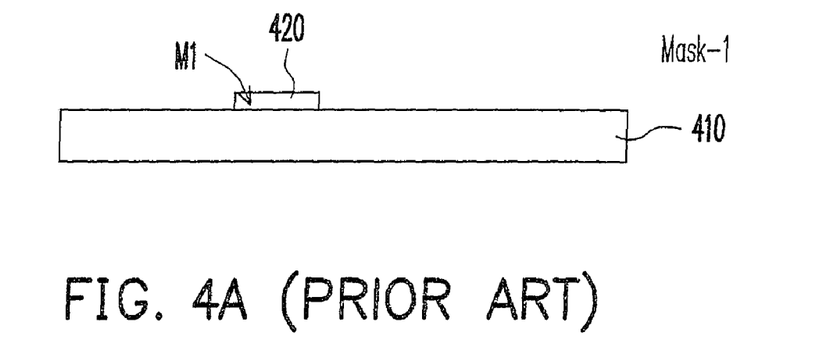
FIGS. 4A-4G are section drawings for showing a process flowchart of a typical TFT.
Figure 4B:
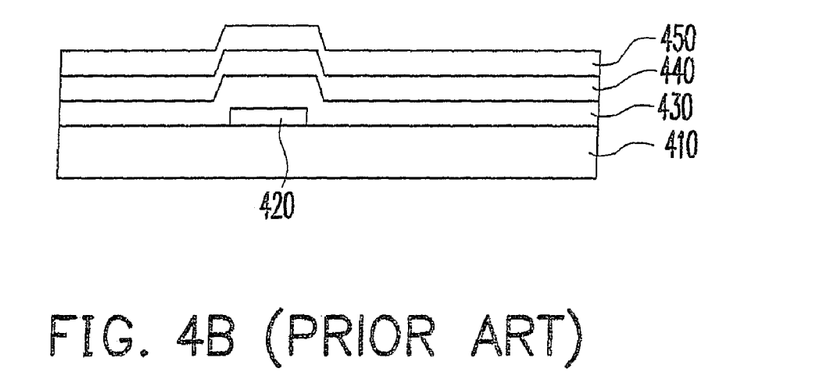
Figure 4C:
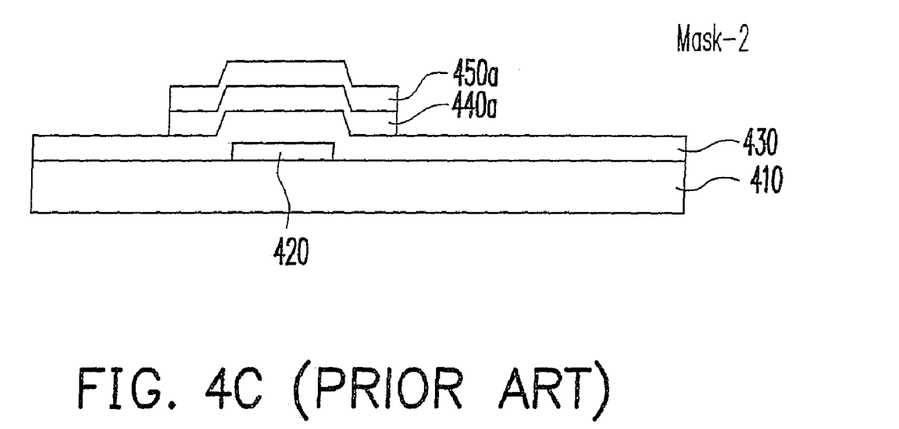
Figure 4D:
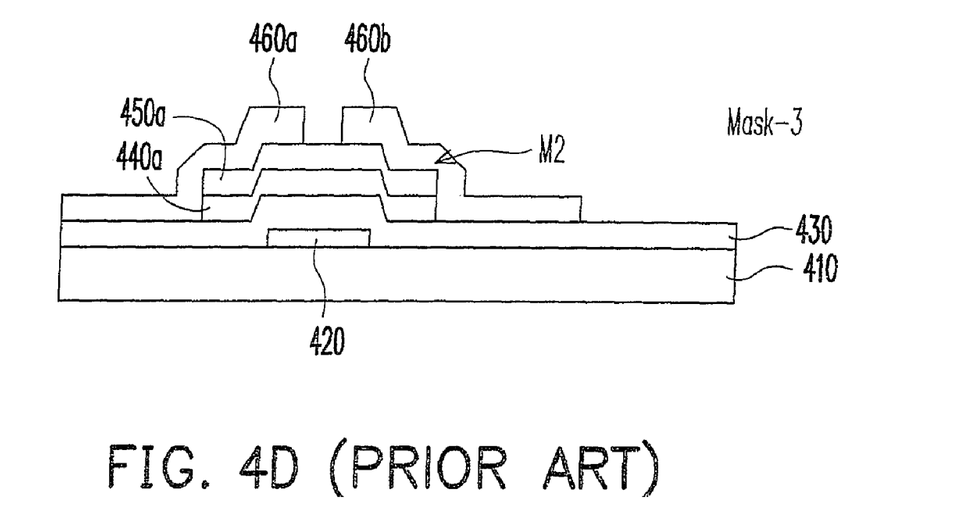
Figure 4E:
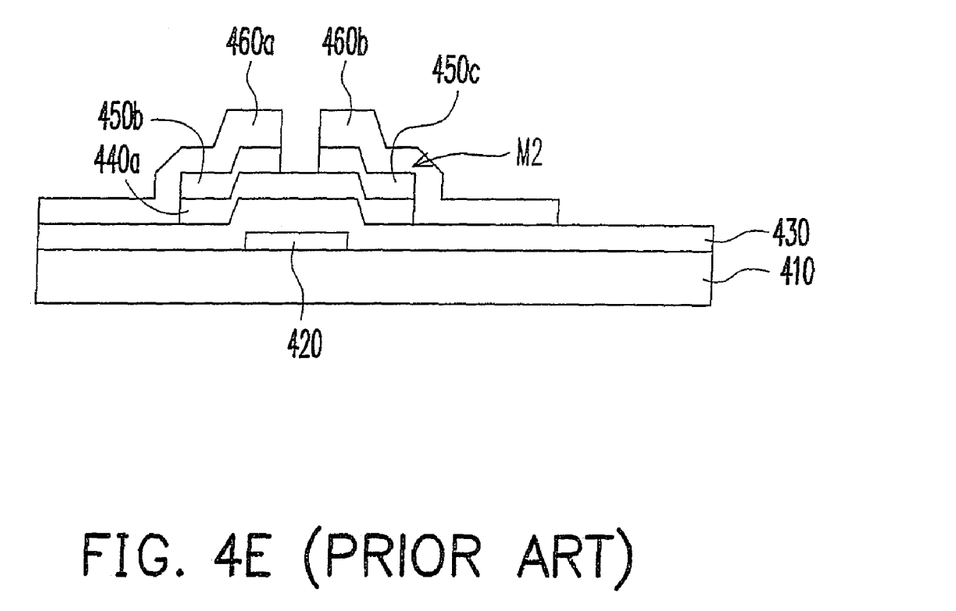

In succession, another metal layer M2 is formed on the substrate 410. Referring to FIG. 4D, a photolithography and an etching are employed, and the metal layer M2 is patterned by a third mask Mask-3 into source/drain metal layers 460a and 460b at both sides of the channel region. Then, by removing the Ohmic contact layer 450a uncovered by the source/drain metal layers 460a and 460b, two Ohmic contact portions 450b and 450c are formed. The basic structure fabrication of a TFT is completed hereto in the above-described process.

Figure 4F:
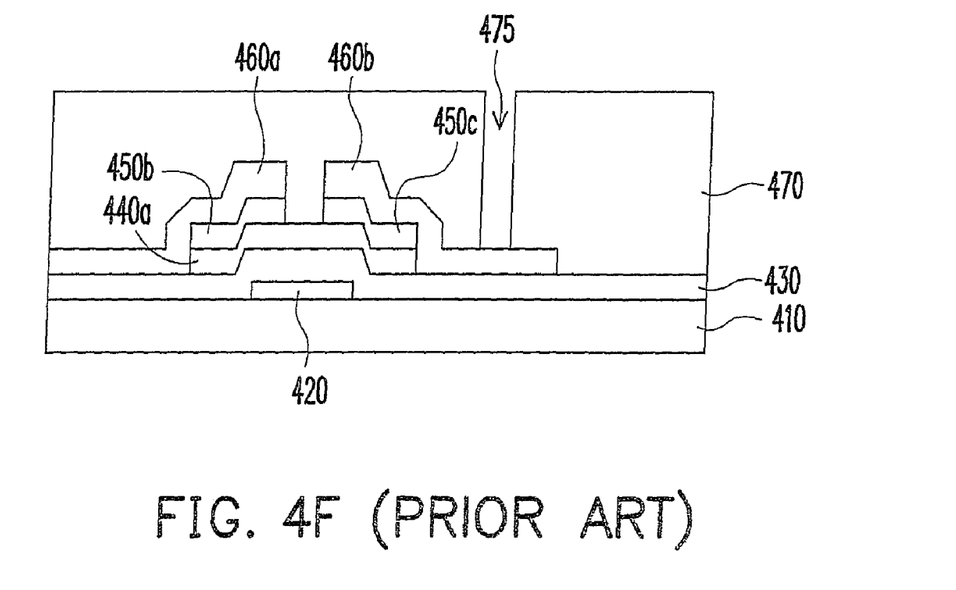
Figure 4G:
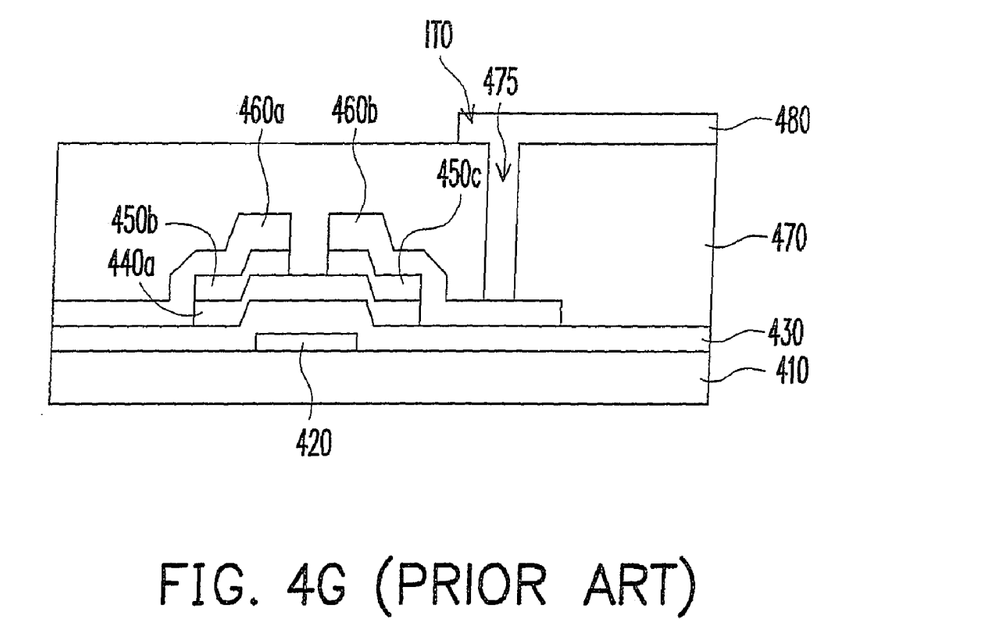

In the end, referring to FIG. 4F, a passivation layer 470 is further formed on the substrate 410 for covering the source/drain metal layers 460a and 460b, the channel region and the insulating layer 430. In addition, a fourth mask Mask-4 is used for forming a hole 475 in the passivation layer 470. The hole 475 is able to expose the partial source/drain metal layer 460b. And, a transparent electrode layer, for example, an indium tin oxide (ITO) layer, is formed on the passivation layer 470, followed by forming a pixel electrode 480 using a fifth mask Mask-5. It can be noticed that the finally formed portion of the pixel electrode 480 on the passivation layer 470 fills the hole 475 for electrically connecting the source/drain metal layer 460b in the LCD display application.

Figure 5A:
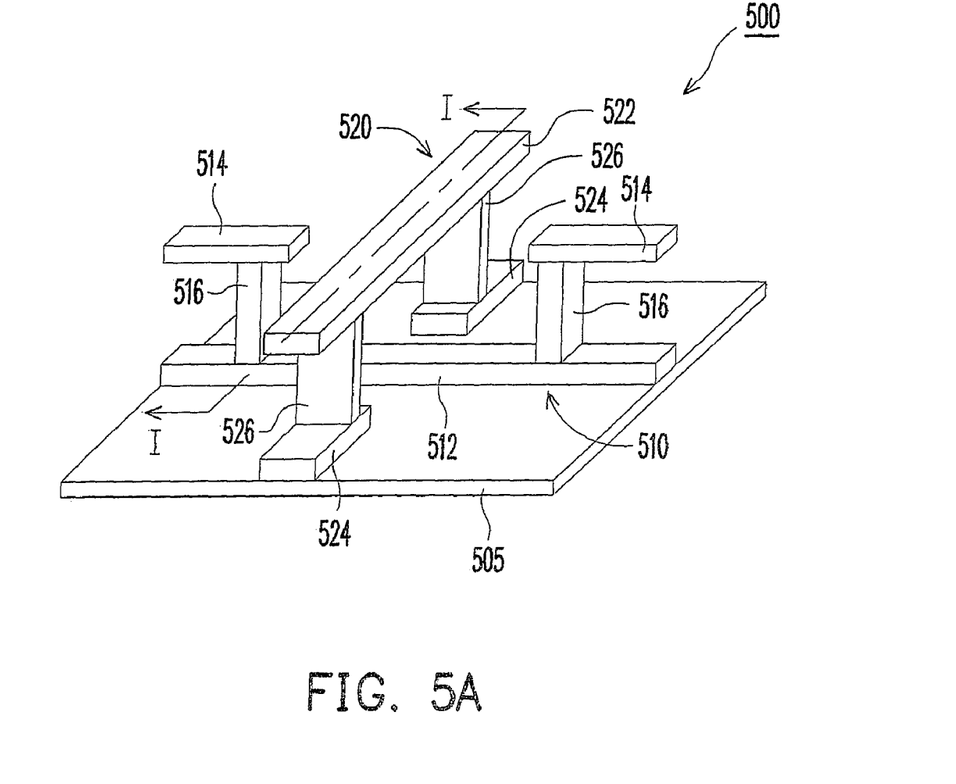
FIG. 5A is a schematic partial 3-dimentional drawing of a multi-layered complementary conductive line structure.
Figure 5B:
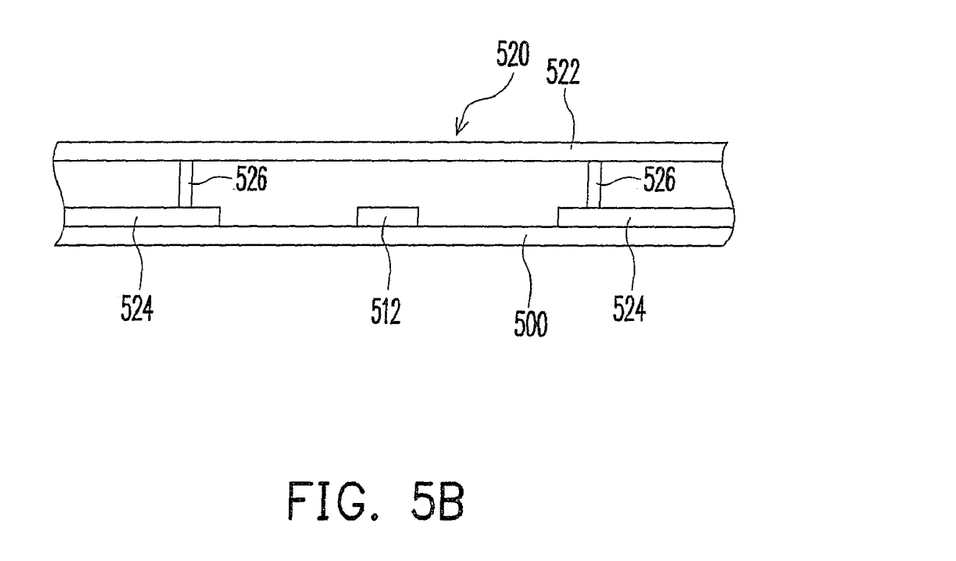
FIG. 5B is the section drawing along sectioning plane I-I at the multi-layered complementary conductive line structure 500 in FIG. 5A.

The inventor of the present invention provided "multi-layered complementary conductive line structure and manufacturing method thereof" on the Patent Official Gazette R.O.C. with certificate number I220775 and publication number 200514194, referring to FIGS. 5A and 5B, which is a corresponding application of U.S. patent application, Ser. No. 10/687,759, filed on Oct. 20, 2003, all disclosures of which are incorporated herewith by reference. FIG. 5A is a schematic partial 3-dimensional drawing of a multi-layered complementary conductive line structure, and FIG. 5B is the section drawing along sectioning plane I-I at the multi-layered complementary conductive line structure 500 in FIG. 5A. The multi-layered complementary conductive line structure 500 is formed on a substrate 505 and comprised of a scan line structure 510 and a data line structure 520. The scan line structure 510 includes a main-line 512 and a plurality of branch-lines 514, and 512 and 514 are connected to each other through a plug 516. While the data line structure 520 includes a main-line 522 and a plurality of branch-lines 524, and 522 and 524 are connected to each other through a plug 526. Moreover, the main-line 512 of the scan line structure 510 and the branch-lines 524 of the data line structure 520 are made in a same metal layer; the main-line 522 of the data line structure 520 and the branch-lines 514 of the scan line structure 510 are made in another same metal layer. By means of the bilayer-overpassed line structure, the resistances of both the scan lines and the data lines are effectively reduced. Although such scheme can solve the line resistance problem, nevertheless it needs extra masking processes for manufacturing underlying TFTs. Therefore, such scheme still requires a higher cost.

Figure 6:
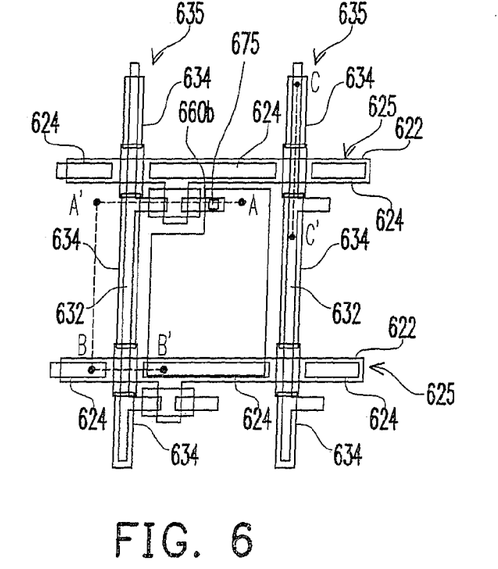
FIG. 6 is a pixel layout diagram of a display array with a multi-layered complementary conductive line structure according to an embodiment of the present invention.
Figure 6A:
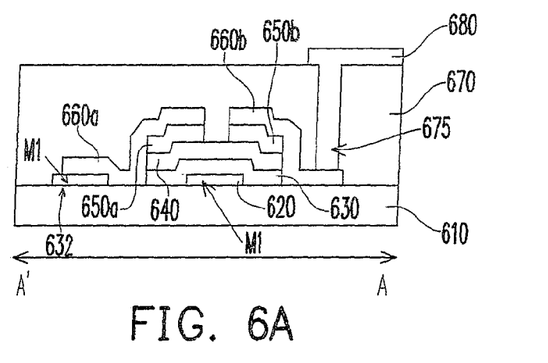
FIGS. 6A, 6B and 6C are the section drawings along sectioning planes A-A', B-B' and C-C' at the multi-layered complementary conductive line structure in FIG. 6, respectively.
Figure 6B:
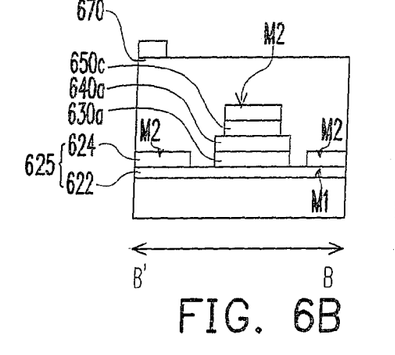
Figure 6C:
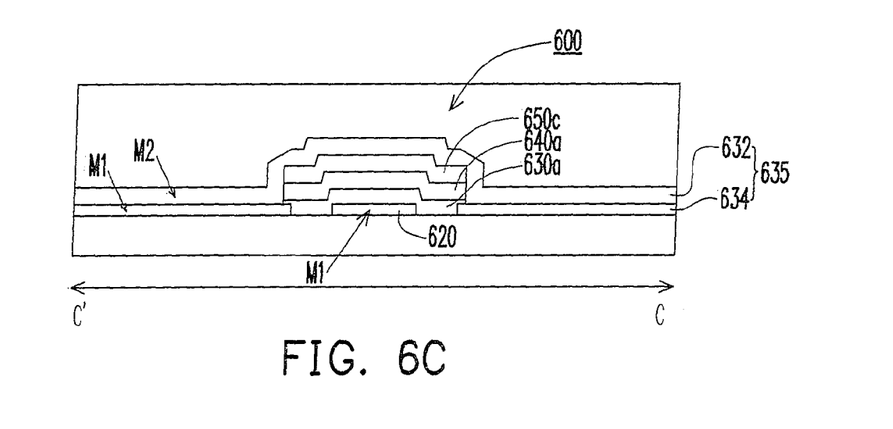

Based on the above-described background, the present invention provides a manufacturing process of a bi-layered complementary conductive line structure and a display array without increasing the current mask number capable of solving the problem of line resistance inside a display. According to the embodiment of the present invention, the circuit layout of the display array having the bi-layered complementary conductive line structure is shown in FIG. 6. FIGS. 6A, 6B and 6C are the section drawings along sectioning planes A-A', B-B' and C-C' in FIG. 6, respectively.

FIG. 6A shows a TFT structure, which includes a substrate 610. A metal layer M1 is formed on the substrate 610. By patterning the metal layer M1, a gate 620 is formed on the substrate 610. Then, a patterned gate insulating layer, an active layer and a doping layer, such as an insulating layer 630, an a-Si layer 640 and Ohmic contact layers 650a and 650b, are in sequence formed. By patterning another metal layer M2 on the Ohmic contact layers 650a and 650b, contacting source/drain metal layers 660a and 660b are formed. A passivation layer 670 having a hole 675 serves for covering the source/drain metal layers 660a and 660b, a channel region and the insulating layer 630. A pixel electrode 680 featuring a transparent electrode layer fully fills the contact hole 675 for electrically connecting the source/drain metal layer 660b.

Referring to FIGS. 6B and 6C, a bi-layered complementary conductive line structure 600 provided by the embodiment is formed on the substrate 610 and comprised of a line structure served 625 as a scan line and a line structure 635 served as a data line. Each scan line structure 625 is formed by a gate scan line on the first layer 622 and a plurality of discontinuous gate scan lines on the second layer 624, wherein 624 is connected to 622. Each data line structure 635 is formed by a data line on the second layer 632 and a plurality of discontinuous data lines on the first layer 634, wherein 634 is connected to 632. The gate scan line on the first layer 622 of the scan line structure 625 and the plurality of discontinuous data lines on the first layer 634 of the data line structure 635 locate on a same metal layer. The data line on the second layer 632 of the data line structure 635 and the plurality of discontinuous gate scan lines on the second layer 624 of the scan line structure 625 locate on another metal layer. By means of the bilayer-overpassed line structure, the resistances are effectively reduced.

Figure 7:
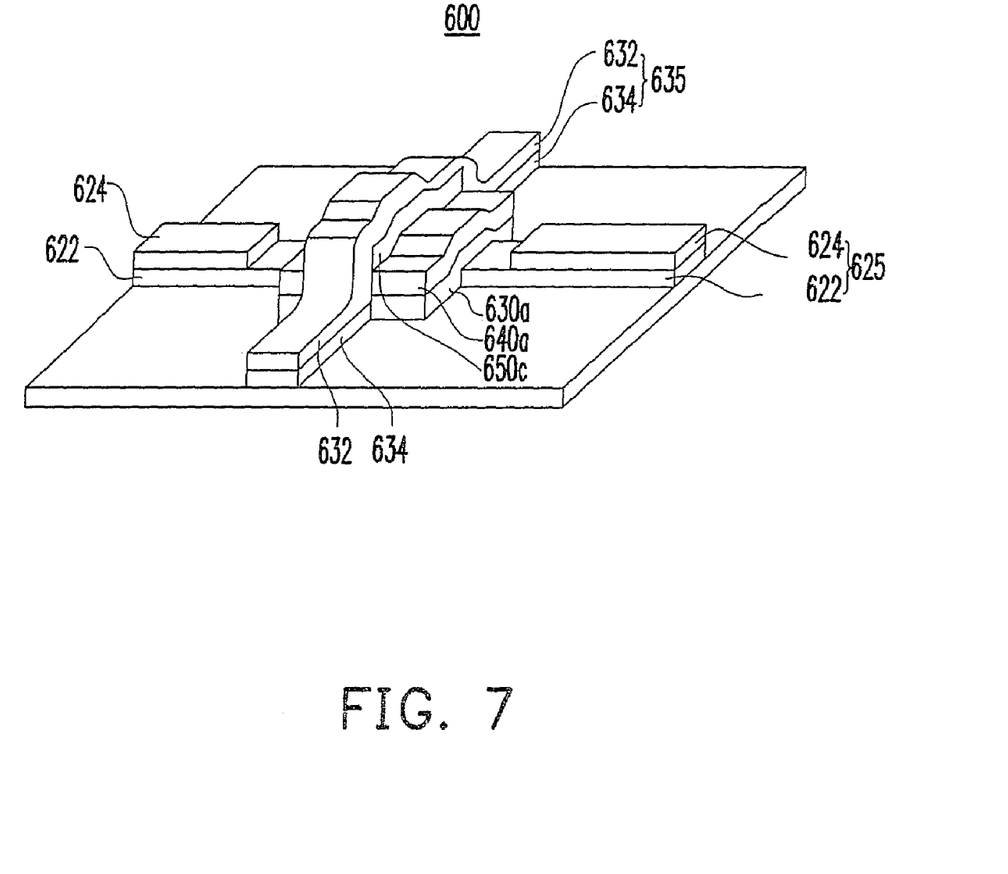
FIG. 7 is a schematic partial 3-dimensional structure drawing at an intersection of a scan line structure and a data line structure according to an embodiment of the present invention.

The isolating portion at an intersection of the scan line structure 625 and the data line structure 635 is defined and formed by the insulating layer, the a-Si layer and the Ohmic contact layer in company with the corresponded pattering process, which doesn't need extra masks. The patterned insulating layer 630a, patterned a-Si layer 640a and Ohmic contact layer 650c isolate the scan line structure 625 from the data line structure 635 at the intersection, shown in FIGS. 6B and 6C. The 3-dimentional drawing of the scan line structure 625 and the data line structure 635 at the intersection is schematic shown in FIG. 7.

The bi-layered complementary conductive line structure 600 of the embodiment can be modified according to a TFT display. For example, the bi-layered complementary conductive line structure 600 can be formed by one of the scan line structure 625 and the data line structure 635 only. In other words, in considering the requirement of line resistance and a yield rate of a display array process, only the scan line structure 625 or the data line structure 635 is designed in the bi-layered complementary conductive line structure 600. In the market today, there are more and more demands on the large-screen TFT displays. Since the panel of the large-screen TFT display generally has a 16:9 aspect ratio of width over height, the RC (resistance-capacitance) delay time problem caused by scan lines is more noticeable than data lines. Therefore, for example, only the scan line structure 625 is designed in the bi-layered complementary conductive line structure of the present invention for solving the RC delay problem.

FIGS. 8A-8E are pixel layout diagrams of a multi-layered complementary conductive line structure in company with a process flowchart of a display array according to an embodiment of the present invention, wherein each circuit layout diagram is corresponding to three section drawings along sectioning planes A-A', B-B' and C-C', respectively.

Figure 8A:
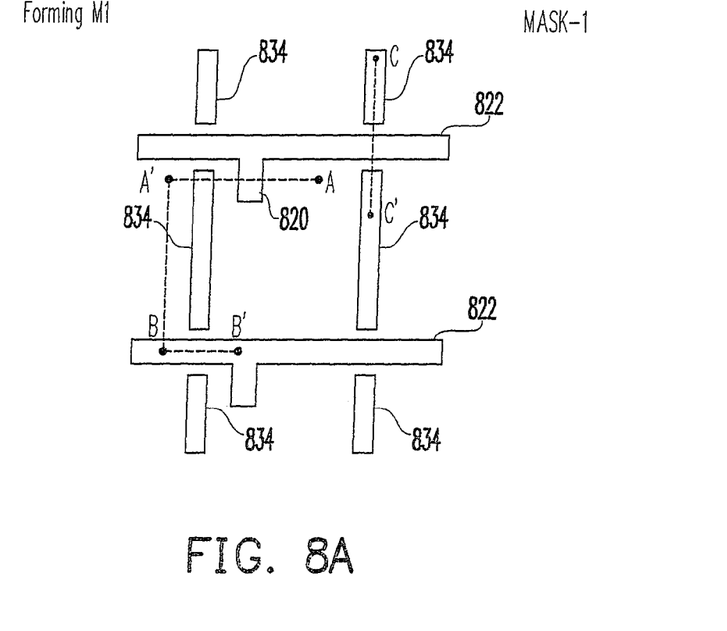
FIGS. 8A-8E are circuit layout diagrams of a multi-layered complementary conductive line structure in company with a process flowchart of a display array according to an embodiment of the present invention, wherein each pixel layout diagram is corresponding to three section drawings along sectioning planes A-A', B-B' and C-C', respectively.
Figure 8A:
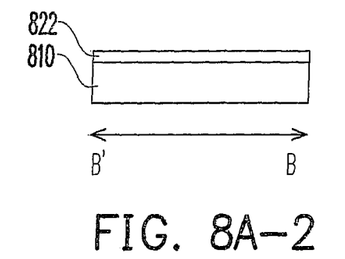
Figure 8A:
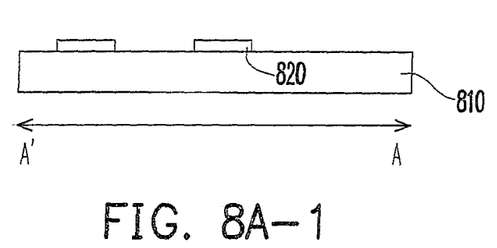
Figure 8A:
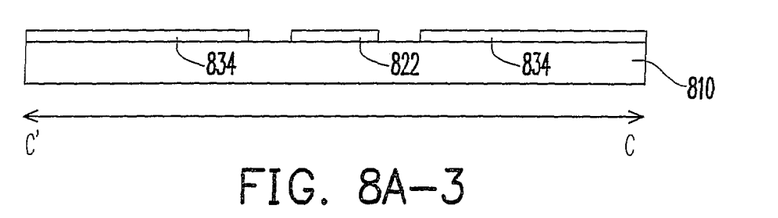
Figure 8B:
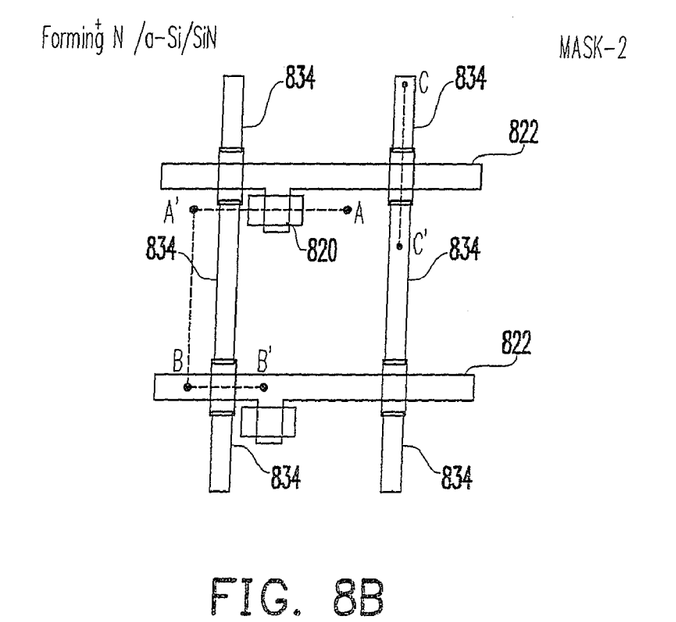

Firstly, referring to FIG. 8A-1, it is the section drawing along sectioning plane A-A'. In the TFT manufacturing process, a metal layer M1 is formed on a substrate 810 at the beginning. The substrate 810 can be a quartz substrate, a glass substrate, or a plastic substrate, etc. The metal layer can be a conductive material made of aluminum metal or copper metal. Then, a photolithography and an etching are employed, and the metal layer M1 is patterned by a first mask Mask-1 into a gate 820 on the substrate 810. Meanwhile, a gate scan line on the first layer 822 of the scan line structure is fabricated, referring to FIG. 8A-2, the section drawing along sectioning plane B-B'. In addition, a plurality of discontinuous data lines on the first layer 834 of the data line structure is fabricated too, referring to FIG. 8A-3, the section drawing along sectioning plane C-C'.

Next, referring to FIGS. 8B, 8B-1, 8B-2 and 8B-3, an insulating layer, an a-Si layer and an Ohmic contact layer are globally formed by means of deposition in sequence on the substrate 810, so that the gate 820, the gate scan line on the first layer 822 and the discontinuous data lines on the first layer 834 are covered. The Ohmic contact layer is made of n+a-Si. Then, a photoresist layer is formed on the Ohmic contact layer and the photoresist layer is patterned by a second mask Mask-2. The patterned photoresist layer serves as a new mask for etching the Ohmic contact layer, the a-Si layer and the insulating layer. The etching can be, for example, a dry etching for removing the Ohmic contact layer, the a-Si layer and the insulating layer uncovered by the patterned photoresist layer, so that a patterned insulating layer 830, a patterned a-Si layer 840 and a patterned Ohmic contact layer 850 are formed, by which a channel region is defined. In the process step, a distinguished point from the described hereinbefore is that the insulating layer is also patterned in favor of the successive process.

Figure 8B:
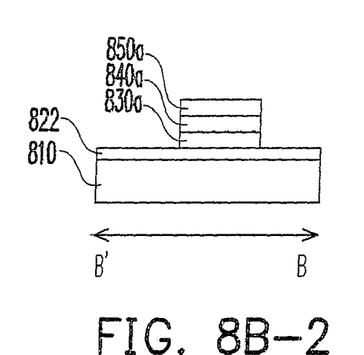
Figure 8B:
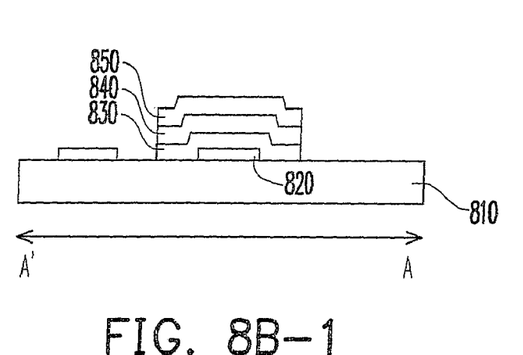
Figure 8B:
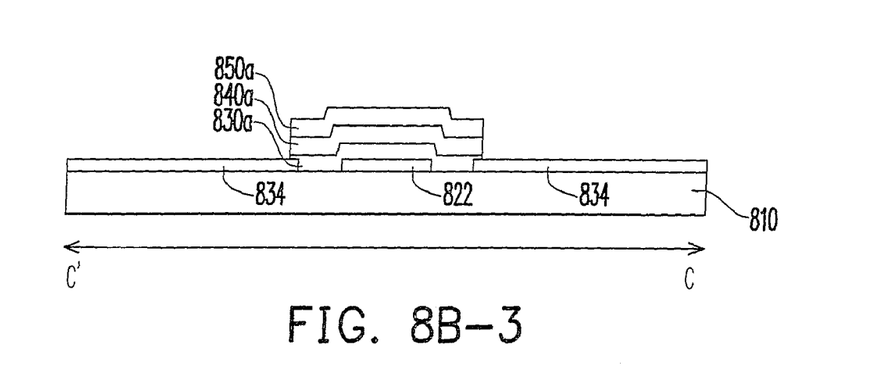

Referring to FIGS. 8B-2 and 8B-3, an isolating portion at an intersection of the scan line structure and the data line structure is defined and formed by the insulating layer, the a-Si layer and the Ohmic contact layer, which form the partial structure of a TFT. In other words, the patterned insulating layer 830a, the patterned a-Si layer 840a and the patterned Ohmic contact layer 850a isolate the scan line structure from the data line structure at the intersection.

Figure 8C:
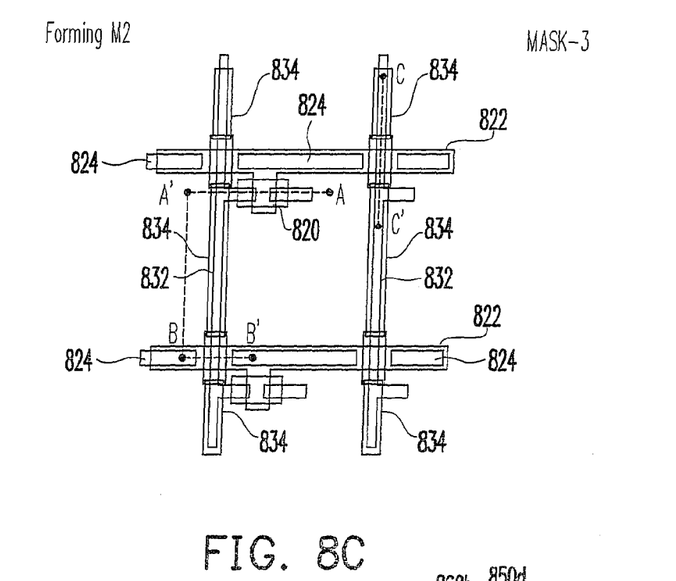
Figure 8C:
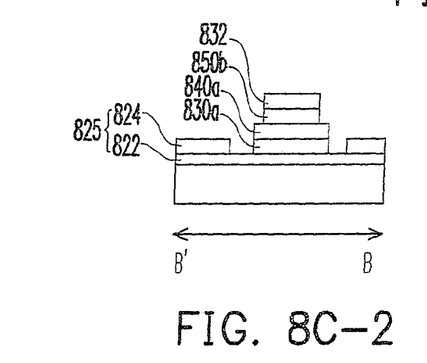
Figure 8C:
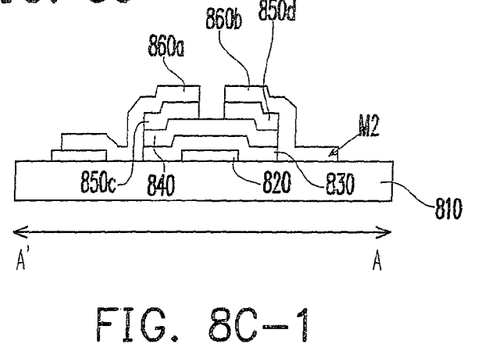
Figure 8C:
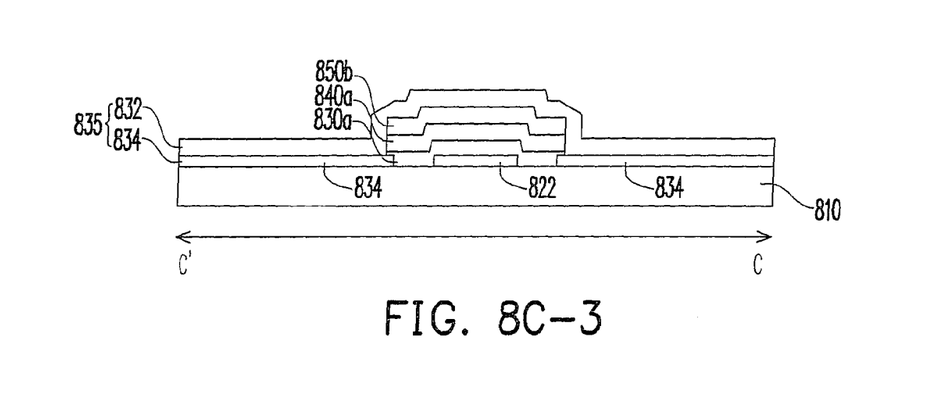

Further, referring to FIGS. 8C, 8C-1, 8C-2 and 8C-3, another metal layer M2 is formed on the substrate 810, and a photolithography and an etching are employed for patterning the metal layer M2 with a third mask Mask-3. Referring to FIG. 8C-1, source/drain metal layers 860a and 860b are formed at both sides of the channel region. Then, by removing the Ohmic contact layer 850 uncovered by the source/drain metal layers 860a and 860b, two Ohmic contact portions 850c and 850d are formed. The basic structure fabrication of a TFT is completed hereto in the above-described process. Referring to FIG. 8C-2, meantime, a plurality of discontinuous gate scan lines on the second layer 824 of the scan line structure is made. The scan line structure 825 of the embodiment is formed by connecting the gate scan line on the first layer 822 to the plurality of discontinuous gate scan lines on the second layer 824. Referring to FIG. 8C-3, meantime, the data line structure on the second layer 832 is also made. The data line structure of the embodiment 835 is formed by connecting the plurality of discontinuous data lines on the first layer 834 to the data line on the second layer 832.

Figure 8D:
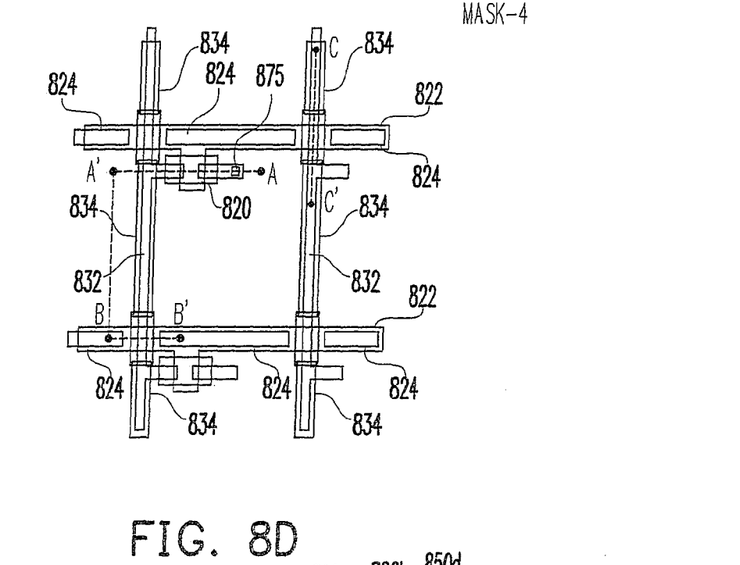
Figure 8D:
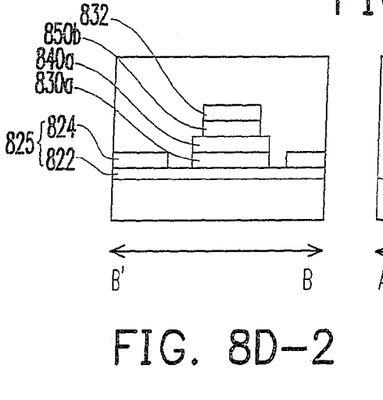
Figure 8D:
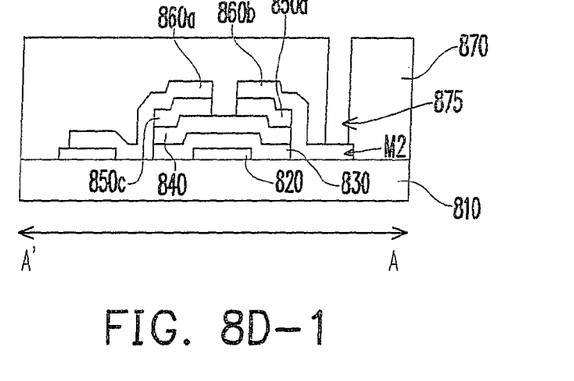
Figure 8D:
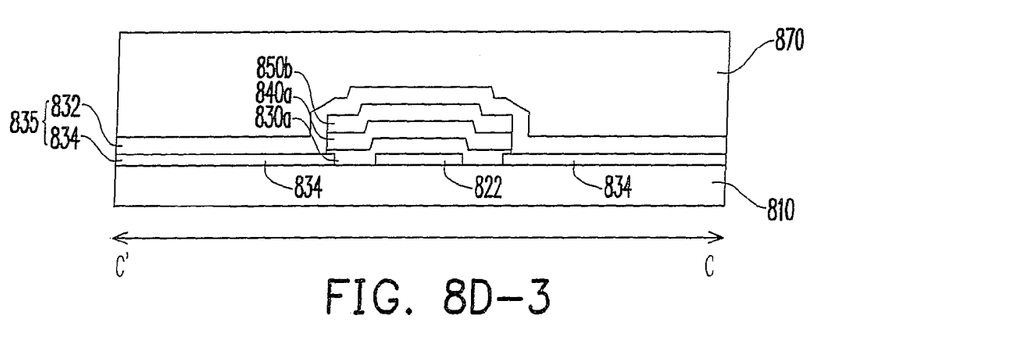
Figure 8E:
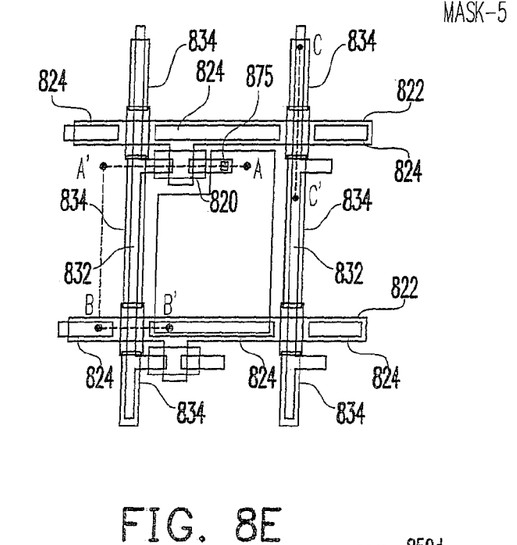
Figure 8E:
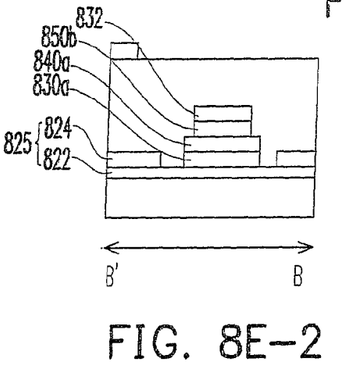
Figure 8E:
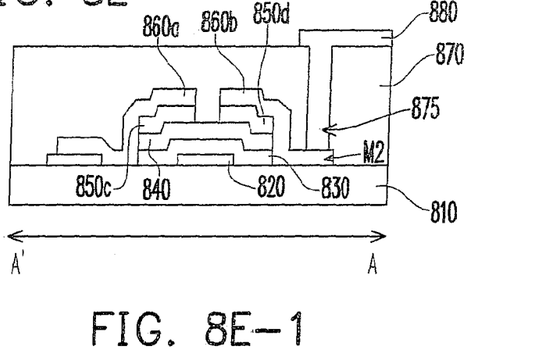
Figure 8E:
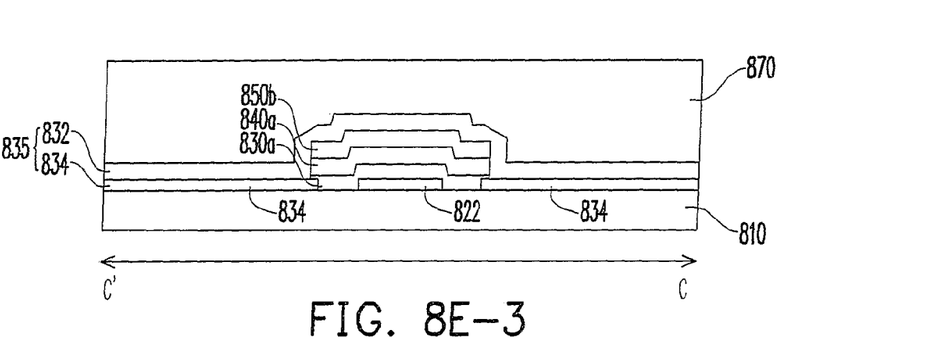

In the end, referring to FIG. 8D, a passivation layer 870 is further formed on the substrate 810 for covering the TFT structure, the scan line structure and the data line structure. In addition, a fourth mask Mask-4 is used for forming a hole 875 in the passivation layer 870. The hole 875 is able to expose the partial source/drain metal layer 860b. And, referring to FIG. 8E, a transparent electrode layer, for example, an indium tin oxide (ITO) layer, is formed on the passivation layer 870, followed by forming a pixel electrode 880 using a fifth mask Mask-5. It can be noticed that the finally formed portion of the pixel electrode 880 on the passivation layer 870 fills the hole 875 for electrically connecting the source/drain metal layer 860b in the LCD display application.

It can be seen from the above described, the present invention provides a bi-layered complementary conductive line structure and a manufacturing method of TFT display array. By means of manufacturing TFT display arrays having the bi-layered complementary conductive line structure without increasing the current masks (reticles) in the process, the line resistance problem of a display is solved. Among the two line structures, the scan line structure and the data line structure, either one of them or both of them can be designed in bi-layered complementary conductive line structure.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A multi-layered complementary conductive line structure, comprising:
   a first conductive line, comprising at least:
      a first main-line;
      a plurality of first branch-lines, wherein a surface of each of the first branch-line and a surface of the first main-line are directly fitting-contacted to each others to form a first line structure; and
   a second conductive line, comprising at least:
      a second main-line;
      a plurality of second branch-lines, wherein a surface of the each second branch-line and a surface of the second main-line are directly fitting-contacted to each others to form a second line structure,
   wherein the first main-line and the second main-line are perpendicular to each other and arranged in cross manner to form an intersection region and an non-intersection region, and
   an insulating structure, disposed between the first main-line and the second main-line to isolate the first main-line and the second main-line from each other, wherein the insulating structure is not disposed in the non-intersection region, such that the first branch-lines and the first main-line in the non-intersection region are directly contacted to each other, and the second branch-lines and the second main-line in the non-intersection region are directly contacted to each other.

2. A multi-layered complementary conductive line structure, comprising at least:
   a first conductive line, comprising at least:
      a first main-line;
      a plurality of first branch-lines, wherein a surface of the each first branch-line and a surface of the first main-line are directly fitting-contacted to each other to form a first line structure; and
   a second conductive line, wherein the first main-line and the second conductive line are perpendicular to each others and arranged in cross manner to form an intersection region and an non-intersection region; and
   an insulating structure, disposed between the first main-line and the second conductive line to isolate the first main-line and the second conductive line from each other, wherein the insulating structure is not disposed in the non-intersection region, such that the first branch-lines and the first main-line in the non-intersection region are directly contacted to each other.

3. The multi-layered complementary conductive line structure as recited in claim 1, wherein an extending direction of all of the first branch-lines are the same to an extending direction of the first main-line, and an extending direction of all of the second branch-lines are the same to an extending direction of the second main-line.

4. The multi-layered complementary conductive line structure as recited in claim 1, wherein the first main-line and the first branch-lines are not separated from each other, and the second main-line and the second branch-lines are not separated from each other.

5. The multi-layered complementary conductive line structure as recited in claim 1, wherein the insulating structure is a stacked structure comprises an insulating layer, an a-Si layer and an ohmic contact layer.

6. The multi-layered complementary conductive line structure as recited in claim 5, wherein the insulating layer and the a-Si layer have a size larger than that of the ohmic contact layer.

7. The multi-layered complementary conductive line structure as recited in claim 2, wherein an extending direction of all of the first branch-lines are the same to an extending direction of the whole first main-line.

8. The multi-layered complementary conductive line structure as recited in claim 2, wherein the first main-line and the first branch-lines are not separated from each other.

9. The multi-layered complementary conductive line structure as recited in claim 2, wherein the insulating structure is a stacked structure comprises an insulating layer, an a-Si layer and an ohmic contact layer.

10. The multi-layered complementary conductive line structure as recited in claim 9, wherein the insulating layer and the a-Si layer have a size larger than that of the ohmic contact layer.

* * * * *